United States Patent
Hsueh

(10) Patent No.: US 6,670,247 B2
(45) Date of Patent: Dec. 30, 2003

(54) METHOD OF FABRICATING MASK READ ONLY MEMORY

(75) Inventor: Cheng-Chen Calvin Hsueh, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 174 days.

(21) Appl. No.: 09/924,323

(22) Filed: Aug. 8, 2001

(65) Prior Publication Data

US 2002/0177278 A1 Nov. 28, 2002

(30) Foreign Application Priority Data

May 28, 2001 (TW) ........................................ 90112760 A

(51) Int. Cl.$^7$ .......................................... H01L 21/8236
(52) U.S. Cl. ........................ 438/278; 438/275; 438/276; 438/277
(58) Field of Search .............................. 438/278, 276, 438/275, 277

(56) References Cited

U.S. PATENT DOCUMENTS

| 5,308,777 A | 5/1994 | Hong | 438/278 |
|---|---|---|---|
| 5,384,478 A | 1/1995 | Hong | 257/385 |
| 5,510,288 A | 4/1996 | Hong | 438/278 |
| 5,672,532 A | 9/1997 | Hsue et al. | 438/278 |
| 6,468,869 B1 | 10/2002 | Yang et al. | 438/278 |
| 2002/0072242 A1 | 6/2002 | Chang | 438/745 |

FOREIGN PATENT DOCUMENTS

| JP | 403083369 A | 4/1991 |
|---|---|---|
| JP | 405102434 A | 4/1993 |

*Primary Examiner*—Long Pham
(74) *Attorney, Agent, or Firm*—J.C. Patents

(57) ABSTRACT

A method of fabricating a mask read only memory. Embedded bit line are formed in a substrate. A gate dielectric layer and a word line are formed on the substrate. The word line is perpendicular to the bit lines. The substrate under the word line and between each pair of the bit lines is referred as a memory unit. A first dielectric layer is formed to cover the substrate. A plurality of coding windows is formed in the first dielectric layer over the memory units. Ions are implanted into the memory cells exposed by the coding windows, and a second dielectric layer is formed to fill the coding windows.

18 Claims, 3 Drawing Sheets

METHOD OF FABRICATING MASK READ ONLY MEMORY

CROSS-REFERENCE TO RELATED APPLICATION

This application claims the priority benefit of Taiwan application serial no. 90112760, filed on May 28, 2001.

BACKGROUND OF THE INVENTION

1. Field of the Invention

The invention relates in general to a semiconductor process. More particularly, the invention relates to a method of fabricating a masked read only memory (MROM).

2. Description of the Related Art

The masked read only memory is the most basic structure and has the most simple fabrication process of the various kinds of read only memories. The memory cell of the masked read only comprises a MOS transistor. While programming, the channel region under the gate is implanted with ions to change the threshold voltage $V_T$. In the masked read only memory, the data value is represented by the threshold voltage of the memory cell. By turning on/off the channel region of the memory cell under the gate, the data value is accessed. The on/off state is determined by the threshold voltage of the memory cell.

A conventional method of fabricating a mask read only memory is shown in FIGS. 1A to 1C. In FIG. 1A, embedded bit lines 110 (perpendicular to the paper surface) and the isolation oxide layers 120 on the bit lines 110 are formed on the substrate 100. A gate oxide layer 130 is formed over the substrate 100. A word line 140 perpendicular to the bit lines 110 is formed. The substrate between a pair of the bit lines 110 and under the word line 140 is defined as a memory unit 144.

In FIG. 1B, a coding step is performed. A photoresist layer 150 patterned with a coding window 153 that exposes a part of the memory unit 144 is formed. The coding window 153 has a width larger than the width of the memory unit 144. The memory unit 144 is implanted with ions 160 to enhance the threshold voltage thereof. The coding process is complete.

In FIG. 1C, the photoresist layer 150 is removed, a dielectric layer is formed over the substrate 100, and the subsequent process is performed.

In the above conventional method, as the coding window 153 in the photoresist layer 150 is wider than the memory unit 144 as shown in FIG. 2, the implanted ions 160 easily diffuse to positions outside the memory unit 144. The threshold voltage and the channel threshold current are thus altered, thereby affecting the accuracy of data access.

SUMMARY OF THE INVENTION

The invention provides a method of fabricating a mask read only memory. Embedded bit lines are formed in a substrate. A gate dielectric layer and a word line are formed on the substrate. The substrate between a pair of the bit lines and under the word line is referred as a memory unit. A first dielectric layer is formed to cover the substrate. Several coding windows are formed in the first dielectric layers over a portion of the first dielectric layer. Spacers are formed on sidewalls of the coding windows. Using the first dielectric layer and the spacers as a mask, ions are implanted into the memory unit. A second dielectric layer is formed to fill the coding windows.

The invention further provides a programming method of a masked read only memory. After forming the bit lines and the word line across each other, a dielectric layer is formed to cover the substrate. A plurality of coding windows is formed in the first dielectric layer. The coding windows expose the memory units between two neighbouring bit lines and under the word line. Spacers are formed on sidewalls of the coding windows. Using the spacers and the first dielectric layer as a mask, the memory units under the coding windows are implanted with ions.

As mentioned above, spacers are formed on sidewalls of the coding windows in the invention. The ion implantation coverage is thus reduced. Ions are thereby prevented from diffusing to positions other than the memory units. Therefore, while programming the mask read only memory, the accuracy of data storage and access is not affected.

Both the foregoing general description and the following detailed description are exemplary and explanatory only and are not restrictive of the invention, as claimed.

DESCRIPTION OF THE PREFERRED EMBODIMENTS

Figure 1A:
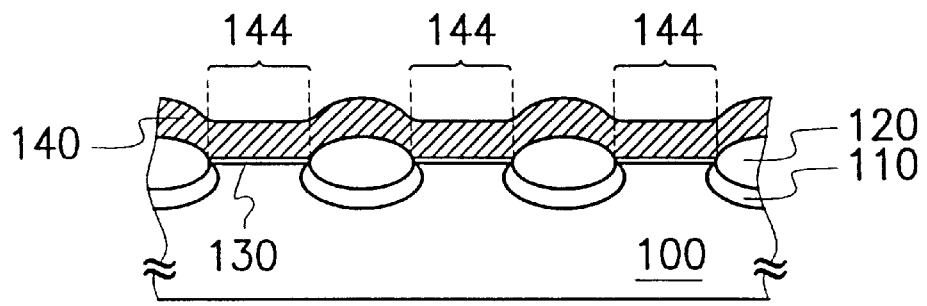
FIGS. 1A to 1C show a conventional method of fabricating a mask read only memory.
Figure 1B:
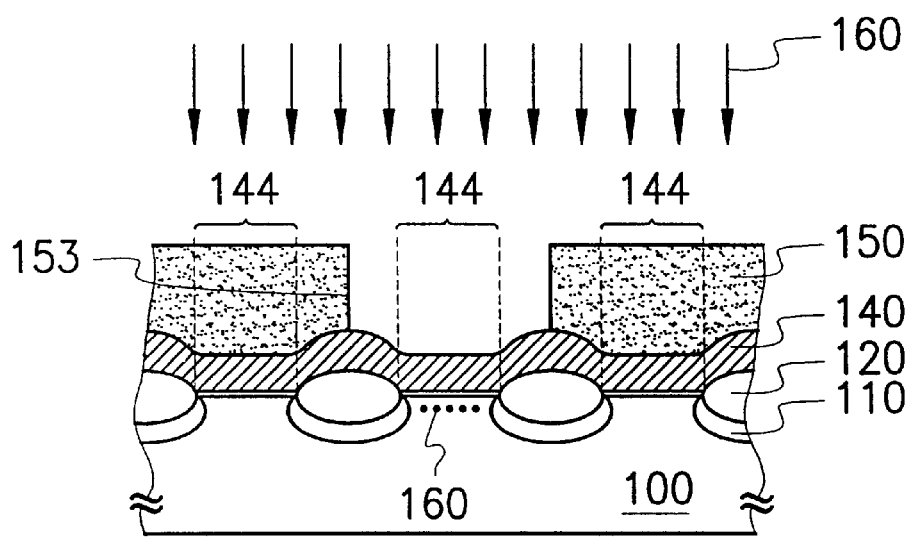
Figure 1C:
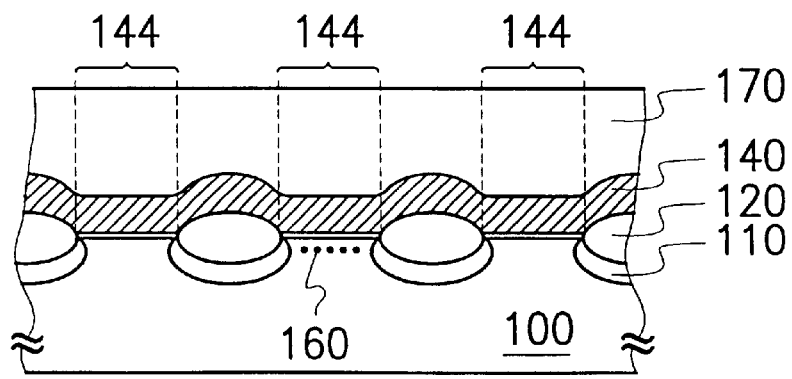
Figure 2A:
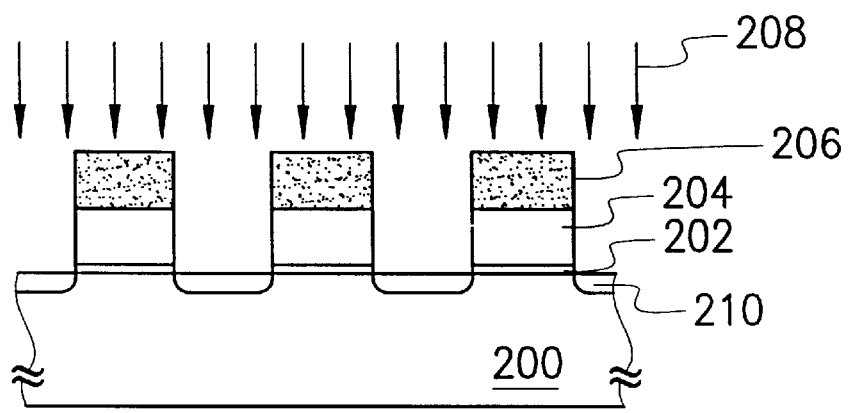
FIGS. 2A to 2F show the fabrication process of forming a mask read only memory according to the invention.

FIG. 2A to FIG. 2F show the fabrication process of a mask read only memory in one embodiment of the invention. In FIG. 2A, a pad oxide layer 202, a mask layer 204 and a patterned photoresist layer 206 are formed on a substrate 200 in sequence. Using the photoresist layer 206 as a mask, the exposed photoresist mask layer 204 and the pad oxide layer 202 beneath are removed. Using the photoresist layer as a mask again, the exposed substrate 200 is doped to form embedded bit lines 210.

Figure 2B:
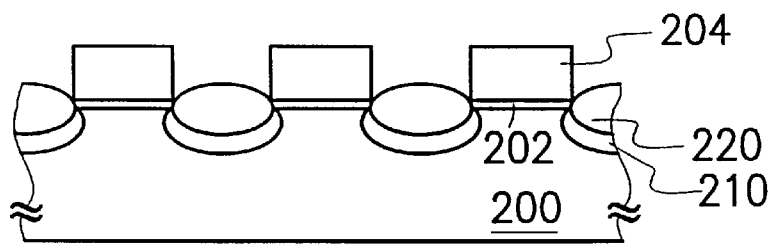

In FIG. 2B, the photoresist layer 206 is removed, followed by a step of thermal oxidation. Isolation oxide layers 220 are thus formed by thermal oxidation of the exposed surface of the substrate 200, and the bit lines 210 are thus covered thereby.

Figure 2C:
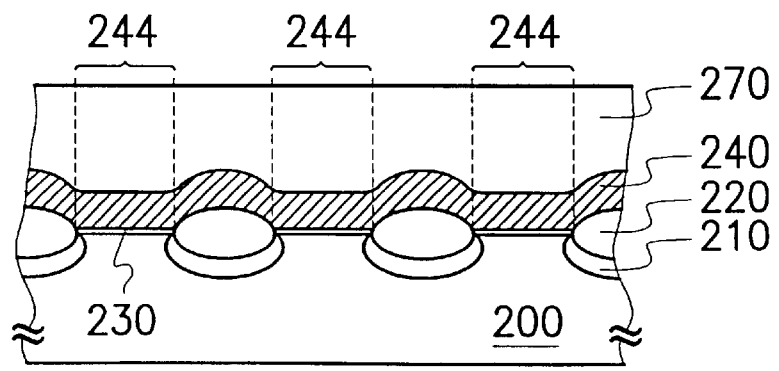

In FIG. 2C, the remaining mask layer 204 and the remaining pad oxide layer 202 are removed. A gate oxide layer 230 is formed on the substrate 200. A word line 240 is formed perpendicularly across the bit lines 210. The substrate 200 between two neighbouring bit lines 210 and under the word lines 240 are referred as the memory units 244. A dielectric layer 270 is formed over the substrate 200 with a thickness of about 1000 Å to about 2000 Å. The dielectric layer 270 is planarized using chemical mechanical polishing (CMP), for example.

Figure 2D:
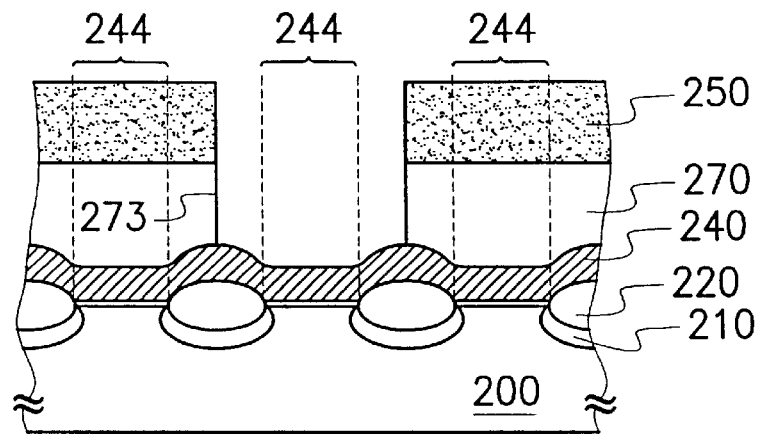
Figure 2E:
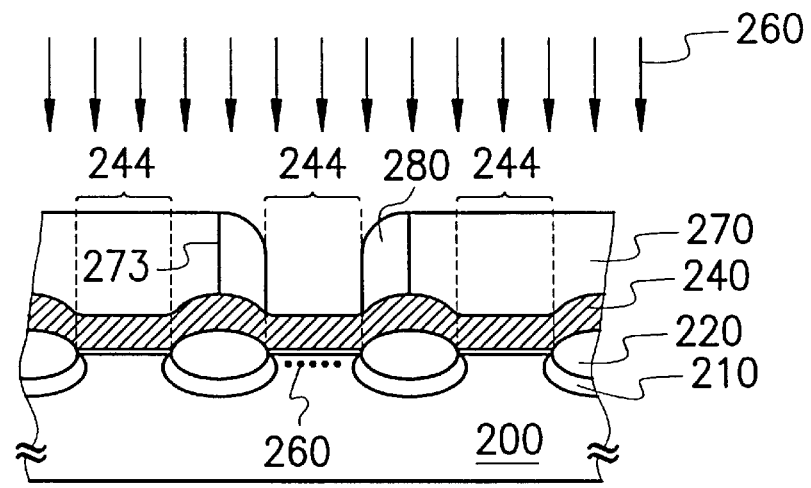

In FIGS. 2D and 2E, the coding process is performed. In FIG. 2D, a patterned photoresist layer 250 is formed over the substrate 200. The photoresist layer 250 exposes a part of the dielectric layer 270 over memory units 244. The exposed dielectric 270 is removed to form coding windows 273 therein.

In FIG. 2E, spacers 280 are formed on sidewalls of the coding windows 273, such that the region to be implanted with ions is narrowed. The material of the spacers 280 comprises silicon oxide, for example. Ions 260 are implanted into the memory units 244 to raise the threshold voltage for coding. When the substrate 200 is a P-type substrate, the boron ions can be used in the implantation step.

Figure 2F:
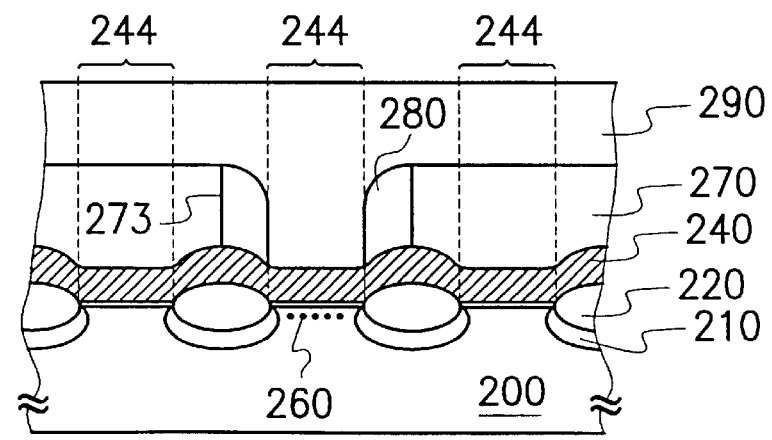

In FIG. 2F, a dielectric layer 290 is formed to fill the coding windows 273. A planarization step is performed on the dielectric layer using chemical mechanical polishing, for example.

According to the above, spacers are formed on sidewalls of the coding windows, so that the ion implanted range is shrunk to prevent the diffusion of ions towards positions outside the memory units. In addition, the invention performs the coding process after forming the dielectric layer, so that the number of the required photolithography processes is the same as that of the conventional method without affecting the turn around time (TAT).

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating a masked read only memory, comprising:
    providing a substrate;
    forming a plurality of embedded bit lines in the substrate;
    forming a dielectric layer and a plurality of word lines on the substrate, wherein the word lines perpendicularly cross over the embedded lines, and the substrate between two neighbouring bit lines under the word lines is referred as a plurality of memory units;
    forming a first dielectric layer over the substrate;
    forming a plurality of coding windows in the first dielectric layer over the memory units;
    forming a plurality of spacers on sidewalls of the coding windows;
    implanting the memory units under the coding windows with ions using the first dielectric layer and the spacers as a mask; and
    filling the coding windows with a second dielectric layer.

2. The method according to claim 1, wherein forming the spacers comprises forming a dielectric layer.

3. The method according to claim 1, wherein forming the embedded bit lines comprises:
    forming a mask layer on the substrate;
    forming a plurality of trenches in the mask layer;
    implanting ions into substrate exposed by the trenches to form the embedded bit lines;
    oxidizing an exposed surface of the substrate in the trenches, so that each of the bit lines is covered with an isolation oxide layer; and
    removing the mask layer.

4. The method according to claim 1, further comprising planarization after forming the first dielectric layer.

5. The method according to claim 4, wherein planarization comprises chemical mechanical polishing.

6. The method according to claim 1, further comprising planarization after forming the second dielectric layer.

7. The method according to claim 6 wherein planarization comprises chemical mechanical polishing.

8. The method according to claim 1, wherein forming the first dielectric layer comprises forming a silicon oxide layer.

9. The method according to claim 1, wherein forming the first dielectric layer includes forming the first dielectric layer with a thickness of about 1000 Å to about 6000 Å.

10. The method according to claim 1, wherein implanting ions into the memory units includes implanting boron ions.

11. The method according to claim 1, wherein forming the second dielectric layer includes forming a silicon oxide layer.

12. A method of fabricating a mask read only memory, comprising:
    providing a substrate, the substrate comprising a plurality of embedded bit lines and a plurality of word lines perpendicularly crossing over the bit lines, wherein the substrate between each pair of bit lines and under the word lines is referred as a memory unit;
    forming a dielectric layer over the substrate;
    forming a plurality of coding windows in the first dielectric layer over a part of the memory units;
    forming a plurality of spacers on sidewalls of the coding windows; and
    implanting ions into the memory units under the coding windows.

13. The method according to claim 12, wherein forming the spacers comprises forming a dielectric layer.

14. The method according to claim 1, further comprising planarization after forming the dielectric layer.

15. The method according to claim 14, wherein planarization comprises chemical mechanical polishing.

16. The method according to claim 12, wherein forming the dielectric layer comprises forming a silicon oxide layer.

17. The method according to claim 12, wherein forming the dielectric layer includes forming the first dielectric layer with a thickness of about 1000 Å to about 6000 Å.

18. The method according to claim 12, wherein implanting ions into the memory units includes implanting boron ions.

* * * * *